US005373564A

United States Patent [19]

Spear et al.

[11] Patent Number: 5,373,564

[45] Date of Patent: Dec. 13, 1994

[54] TRANSMISSION LINE FOR PLANAR WAVES

[76] Inventors: Robert J. Spear, 1206 Bryan Point Rd.; Alexander F. Thornhill, 1902 Bryan Point Rd., both of Accokeek, Md. 20607

[21] Appl. No.: 955,459

[22] Filed: Oct. 2, 1992

[51] Int. Cl.[5] .................... H04R 25/00; H05K 5/00; A47B 81/06

[52] U.S. Cl. .................... 381/160; 381/153; 381/159; 181/156; 181/199

[58] Field of Search .................... 381/88, 90, 153, 159, 381/160; 181/179, 182, 189, 156, 194, 199

[56] References Cited

U.S. PATENT DOCUMENTS

| | | | |
|---|---|---|---|
| 4,173,266 | 11/1979 | Pizer et al. | 181/199 |
| 4,790,408 | 12/1988 | Adair | 181/194 |
| 4,942,939 | 7/1990 | Harrison | 181/156 |
| 4,969,196 | 11/1990 | Nakamura | 381/159 |

OTHER PUBLICATIONS

Howard M. Tremaine, "Audio Cyclopedia", 1959, p. 1107.

New York Audio Labs, "Time Aligned and Diffraction", vol. 2, No. 3 8/1981.

*Primary Examiner*—Curtis Kuntz
*Assistant Examiner*—Sinh Tran
*Attorney, Agent, or Firm*—Albert M. Zalkind

[57] ABSTRACT

A high fidelity loudspeaker having a driver, e.g., a woofer in a housing, is rear-loaded by a folded passage, i.e., a transmission line, closed at one end by a loudspeaker and open to the environment at the other end. The line has a length equal to the quarter-wave length of the lowest desired frequency. Angled 45° reflectors are used in the transmission line whereby an advancing planar wave from the rear of the speaker is produced from the rear hemispherical wave. The transmission line is conventionally stuffed with fibrous material, such as long fiber wool, which attenuates resonances, absorbs high frequencies and acts as a low pass filter. The acoustic output at the open end of the transmission line has high frequencies filtered out and a low frequency planar wave at maximum possible amplitude emitted in close phase with the front wave of the loudspeaker. This is accomplished by continuous reversal by flat reflectors in a contiguous array, with no discontinuity of reflection, utilizing reflection reversing surfaces. Thereby, a planar wave can be obtained in a predetermined length of passage. The rear planar wave emerges from the housing in substantially additive phase with the driver front wave.

4 Claims, 2 Drawing Sheets

TRANSMISSION LINE FOR PLANAR WAVES

BACKGROUND OF THE INVENTION

1. Field of the Invention

In most conventional speaker systems an enclosure is needed to contain or control the driver's, i.e., woofer's back wave so it will not destructively interfere with the front wave.

Transmission lines are often folded to conserve space, which creates several persistent problems. For example, the loss of acoustic energy at all frequencies, and also the distortion of the rear wave front. Such disadvantages are caused by abrupt discontinuities encountered by the advancing wave at each bend, i.e., direction change in the line, or reduction in cross-sectional area.

Further, early reflections from rear waves nearest the loudspeaker return to it and are audibly transmitted forwardly through the cone. Also, the pressure on the cone created by early reflections causes the woofer's electrical impedance to vary at different frequencies, thus presenting a more difficult load to the driving electronic amplifier.

2. Prior Art

Transmission lines can cause unwanted resonances which affect sound reproduction. A. R. Bailey is believed to be the first to describe a transmission line in 1965, addressing the problem of unwanted resonances by stuffing the line with acoustically absorbent fibers.

The practice of using a folded line to confine or control the rear wave of a woofer is not new. An early example can be found in U.S. Pat. No. 2,277,525 to Mercurius (1941) which shows a labyrinth of great length and volume having numerous 90° bends. This patent shows a resonant system and makes no comment on the relationship of length to frequency response to keep the rear wave in phase with the loudspeaker for increased sound amplitude at low frequencies.

The U.S. Pat. No. 3,186,589 to Dudodgon (1963) is also a resonant system wherein the baffles are intended to disperse and break up the back wave of the speaker, not to enhance low frequencies in phase with the woofer frequency.

Several embodiments of folded transmission lines are presented in U.S. Pat. No. 3,923,123 to Latimer-Slayer (1975). Both resonant and non-resonant variations are shown, including one in which a single diagonal reflector is introduced as a means to taper the cross-sectional area of the transmission line.

In U.S. Pat. No. 4,128,738 to Gallery (1978), two small 45° corner reflectors are shown in a short line without bends. This patent does not show how any reflection is utilized, nor is the device designed to convert the woofer's hemispherical wave to a planar wave.

U.S. Pat. No. 4,244,269 to Karson (1980) describes variations of a transmission line containing two angled baffles. Although identified as "planar reflectors", these are not positioned so as to guide a planar wave front. According to the patent, col. 3, lines 5–10, the angle of the reflectors is not consistent, and their purpose is mainly to divert the wave into chambers where the sound will be lost, col. 3, lines 20–25.

In the U.S. Pat. No. 4,850,452 (1989) to Wolcott, a bass wave loading uses a labyrinth with radiused curves. Although Wolcott's device is more like a horn than a transmission line, the purpose of the curved surfaces is to provide a smooth internal surface, not to guide planar waves.

The bass loading portion of Harrison's patent, U.S. Pat. No. 4,942,939 (1990), is a folded transmission line utilizing chamfered bends, so called, at corners. In effect it acts on sound waves as Wolcott's did. Harrison states that chamfered bends reduce air turbulence.

SUMMARY OF THE INVENTION

Among the objects of the present invention is to provide a novel and improved device for transmitting the rear wave of a high fidelity woofer in a compact transmission line. The line can be the equivalent of a straight line of eight to nine feet and houses woofers of usual size. Within the line a rear wave of the woofer is guided through the entire convoluted length of the line as a planar wave and emerges at the maximum possible amplitude substantially in phase with the front wave.

Early reflections in the audio transmission line are diminished or eliminated; standing waves in the audio transmission line are diminished or eliminated; electrical impedance peaks in the woofer are diminished or eliminated. This is effected by an enclosure wherein an audio transmission passage has been folded into many walled chambers that communicate with each other sequentially. The rear acoustic wave of a high fidelity woofer advances through the sequential chamber passage by means of multiple 45° reflectors connecting the chambers that preserve a planar wave front. To create a more compact enclosure, the cross section of the transmission line reduces area in an initial tapering passage immediately behind the woofer. After reduction, the wave front remains constant in area all the way to the open exit.

It has been found in a best mode that tapering such initial passage enhances the performance of the invention as well as permitting shortening of the overall housing.

The transmission line has a predetermined number of sound wave reversing dihedral pairs of reflectors disposed to have corresponding sides parallel to each other. These coact with walls to create open ended chambers which are sequentially connected to be part of a passage substantially one fourth the wave length of the driver's resonant frequency beginning from the driver chamber and ending at an opening in a housing which emits the reflected rear wave.

At each opening between chambers, a pair of 45° reflectors are placed to reflect the wave 180°, conveying it from one chamber to the subsequent chamber as a planar wave.

Figure 1:
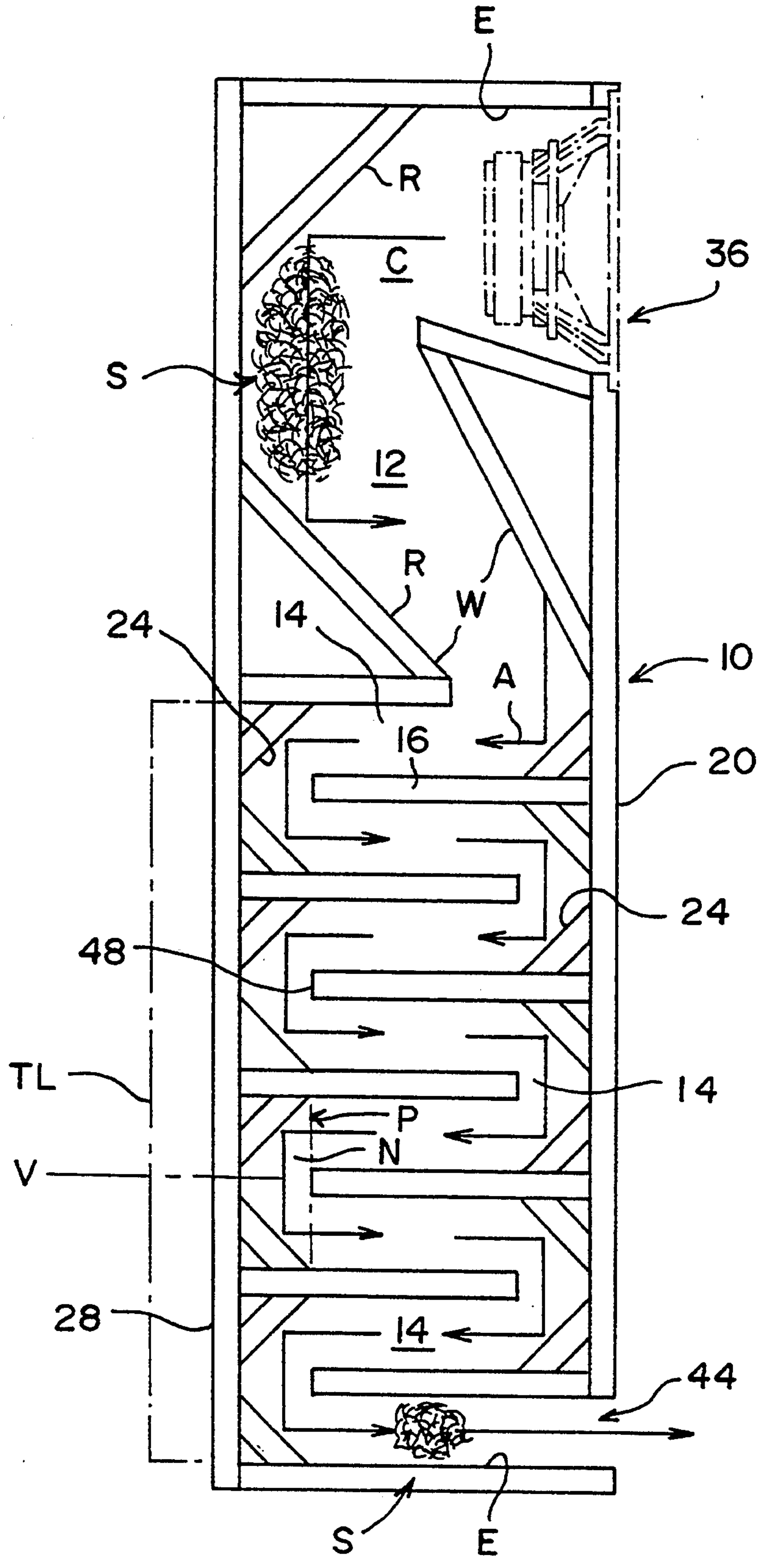
FIG. 1 shows in a best mode an open exposed face side view of an assembly of the invention in a housing understood to be closed by a side wall cover and wherein the basic invention is illustrated for a single speaker and a transmission line comprising interdigitated chambers.

It will be understood that the components such as reflectors, walls, housing sides and ends are secured as an integral construction by glue or other means with the open face as shown on the drawing to be ultimately covered by a sidewall (not shown). The material used is particle or fiber board.

Figure 2:
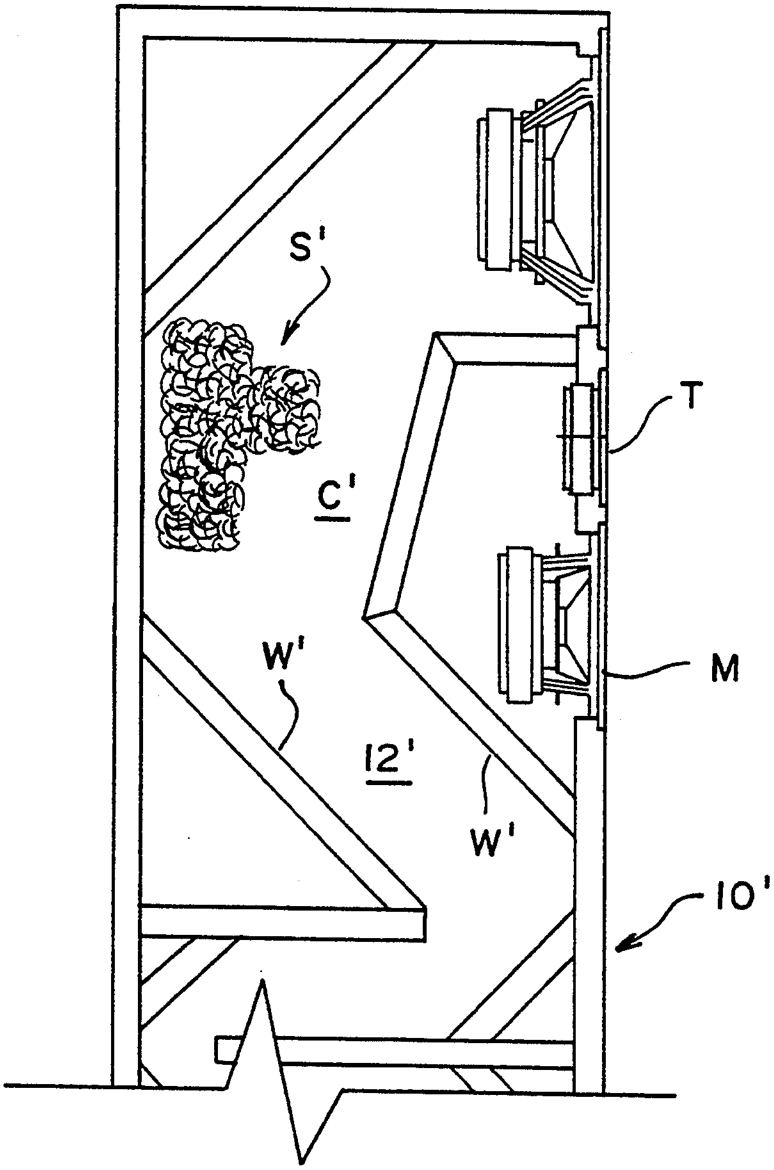

FIG. 2 shows a preliminary embodiment wherein the air passage from the rear of a speaker to interdigitated chambers has parallel walls.

DETAILED DESCRIPTION OF THE EMBODIMENT

In the construction of FIG. 1, a housing 10 contains the passage 12 with walls w-W tapered to converge to a series of interdigitated chambers such as 14 separated by respective interdigitated median walls such as 16 secured to the housing front wall 20, side walls and rear wall 28.

Dihedral reflectors such as 24 in pairs are secured to the housing front and rear walls and at least a distal sidewall at the ends of the median walls.

The housing is understood to be closed by a distal side wall (not shown) in addition to a proximal wall (not shown) which closes the open face, as will be understood.

The housing is completed by respective top and bottom walls E—E as shown. Normal standing wave modes that freely arise along the entire height of the line are damped conventionally by placing symbolized fibrous materials throughout the housing from top to bottom.

Front wall 20 is adapted to carry a selected driver 36 of known frequency usually having a cone.

The input is from the rear of the driver by 45° angle reflectors R—R through a reducing flow cross-sectional area tapered passage 12 to the sequence of dihedral reflector pairs comprised of reflectors 24 fixed at 45° angles to effect dihedral 90° angles that convert the back wave from hemispherical to planar following the flow arrows, to a first chamber 14.

It will readily be apparent that the back wave from the woofer 36 will reversibly follow the sequence of chambers and medial walls for a predetermined travel length, which is the entire passage from the back of the woofer to an open sound outlet 44 of the housing. Such travel length is selected as one-quarter wave length of the lowest sound frequency for which the woofer is designed.

It has been found that a planar wave can be effected from a hemispherical back wave and can retain its planar front in continuous passing through the reversing sequence which provides compactness of front to rear speaker dimension.

In the interdigitated component section TL of the acoustic transmission line the free end 48 of each median wall 16 is in the same plane as the outer ends of the respective fixed reflectors as shown by the dot-dash line P.

Also, the free ends of the walls are directed toward the respective vertices of the dihedral reflector pairs as indicated by the dot-dash line V. This produces some flow area small necking down from the flow areas of the respective passages 14 which is at N advantageous in reducing the overall depth of the housing but does not harm the acoustic effect.

FIG. 2 shows a preliminary prototype wherein the initial passage 12' will be noted as having parallel walls W'W'. An interdigitated component section such as transmission line TL on FIG. 1 has not been shown although understood present. The air chamber C' is shown and also within the housing 10 is a mid-range speaker M and a tweeter T, both isolated from the air chamber, as shown, in a separate chamber.

In general, in an empty line, maximum acoustic effect from the housing opening occurs at a frequency which has a physical wavelength four times the physical length of the passage. This is basic physics for a pipe with one end open and one end closed, the end with the driver is considered the closed end. However, a frequency output from the opening is substantially additive to a driver output in a range wider than for a single frequency.

As would be understood by persons skilled in the art the fractional frequency of the overall construction is determined by the resonant frequency of the driver.

When the line is stuffed with fibers, the band of frequencies passed by the opening can be broadened and shifted depending on the amount of fiber stuffing and also on the cross-sectional area of the passage. Generally speaking, a passage with low stuffing densities and large cross-sectional area will produce a wider band width and have lower bass extension and greater amplitude. Passages with higher stuffing densities and small cross sectional area will produce a narrower band width with reduced low bass and lower amplitude, but with improved transient response.

Obviously, although shown combined on the drawing, separate mid-range and tweeter units can be added to an independent driver unit to create a full range system, due regard being had for cross-over circuitry.

The best mode was discovered to be the use of passage communicating with the rear of the speaker, which passage is tapered wherein the larger end receives the speaker back wave and the smaller end communicates with the series of interdigitated chambers. The change produced is an improved lower bass sound. The improvement in using a tapering passage in the interconnection from the back wave to interdigitated chambers was discovered but is not clearly understood.

The tapered passage also effected the advantage of a smaller housing.

However, experiment showed that in what is considered the best mode the ration of area size of the larger end of the passage which receives the back wave from the cubic volume of the region directly behind the speaker to the smaller end is approximately 1.625 to 1.

Specifically in the best mode the larger end of the tapered passage had a flow area of about 49 square inches approximately. The smaller end of the tapered passage feeding into the chambers had a flow area of about 30 square inches approximately.

An improved speaker was achieved in that the length of the acoustic line could be reduced resulting in a reduction in the front to back dimension of the cabinet by about one inch. The interdigitated length of the acoustic line was then reduced by about one-half foot with a deeper bass response.

Further, with the experimental prototype of a speaker with a parallel wall passage, the housing had to be substantially larger. The cubic volume of the parallel wall prototype was about 5,330 cubic inches as compared with about 4,428 cubic inches in the best mode prototype with tapered passage.

The detailed example of the best mode developed thus far is for illustrative purposes and the invention is not thus limited except as set forth in the appended claim.

We claim:

1. A loudspeaker transmission line (TL) for a driver comprising a series of interdigitated sound reflecting chambers (14) having sound reflecting components in a housing and with a series of parallel median walls (16) dividing said chambers and extending between respective chambers alternately;

pairs of dihedral reflectors (24) reflectively opposed at ends of said parallel median walls (16) for effecting multiple parallel reversing reflections of sound waves;

each of said parallel median walls having a free edge (48);

each said free edge extending toward the vertex of a respective dihedral reflector pair;

an acoustic outlet (44) at the end of said transmission line (TL);

wherein said pairs of dihedral reflectors are related to effect planar wave transmission from the rear of said driver to said outlet at a predetermined frequency which is a fraction of the resonant frequency of the driver.

2. The loudspeaker transmission line as set forth in claim 1 further including a driver (36) to generate a back acoustic wave and means (12) to conduct said back wave to said series of interdigitated sound reflecting chambers.

3. The loudspeaker transmission line as set forth in claim 1 further including means (36) for conducting a hemispherical acoustic wave and a. channel (12) through which said hemispherical acoustic wave is guided to said series of interdigitated sound reflecting chambers.

4. The loudspeaker transmission line as set forth in claim 3 wherein said channel is tapered between said hemispherical means (36) to said series of interdigitated sound reflecting chambers wherein a narrow end of said channel communicates with series of interdigitated sound reflecting chambers.

* * * * *